(12) United States Patent
Lyon et al.

(10) Patent No.: US 10,209,148 B2
(45) Date of Patent: Feb. 19, 2019

(54) FORCE-SENSITIVE FINGERPRINT SENSING INPUT

(71) Applicant: Apple, Inc., Cupertino, CA (US)

(72) Inventors: Benjamin B. Lyon, Cupertino, CA (US); Dale Setlak, Cupertino, CA (US); Michael B. Wittenberg, Cupertino, CA (US); Shin John Choi, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/775,563

(22) PCT Filed: Mar. 15, 2013

(86) PCT No.: PCT/US2013/032683
§ 371 (c)(1),
(2) Date: Sep. 11, 2015

(87) PCT Pub. No.: WO2014/143065
PCT Pub. Date: Sep. 18, 2014

(65) Prior Publication Data
US 2016/0033342 A1 Feb. 4, 2016

(51) Int. Cl.
*G01L 1/14* (2006.01)
*H03K 17/975* (2006.01)

(52) U.S. Cl.
CPC .......... *G01L 1/142* (2013.01); *H03K 17/975* (2013.01); *H03K 2217/960755* (2013.01); *H03K 2217/960765* (2013.01)

(58) Field of Classification Search
CPC . G06F 3/044; G06F 3/045; G01L 1/14; G01L 1/142; G01L 3/106; G06K 9/00;
(Continued)

(56) References Cited

U.S. PATENT DOCUMENTS 5,515,738 A * 5/1996 Tamori .................. G01L 1/16
310/338
6,131,464 A * 10/2000 Pare, Jr. ............. G06K 9/00013
73/714
(Continued)

FOREIGN PATENT DOCUMENTS

GB 2345140 6/2000

OTHER PUBLICATIONS

Bau, et al., "TeslaTouch: Electrovibration for Touch Surfaces," UIST'10, Oct. 3-6, 2010, New York, New York USA, 10 pages.
(Continued)

*Primary Examiner* — Jonathan Dunlap
*Assistant Examiner* — Octavia Hollington
(74) *Attorney, Agent, or Firm* — Brownstein Hyatt Farber Schreck, LLP

(57) ABSTRACT

An object can depress an input device, such as, for example, a function button in an electronic device. A resistive element having a mechanically resistive force can be disposed to resist the depression or movement of the input device. One or more electrodes can be disposed to provide a measure of capacitance based on the depression of the input device. A shield can be disposed to reduce the parasitic capacitance between the one or more electrodes and the object. The electronic device can include a fingerprint sensor operably connected to at least one of the one or more electrodes.

32 Claims, 15 Drawing Sheets

(58) Field of Classification Search
CPC .............. G06K 9/0002; H03K 17/975; H03K 2217/960755; H03K 2217/960765
USPC .................................................... 73/862.626
See application file for complete search history.

(56) References Cited

U.S. PATENT DOCUMENTS

| | | | | |
|---|---|---|---|---|
| 6,647,133 | B1* | 11/2003 | Morita | G06K 9/00013 340/562 |
| 6,912,299 | B1* | 6/2005 | Hoshino | G06K 9/00013 340/5.53 |
| 7,211,885 | B2 | 5/2007 | Nordal et al. | |
| 7,545,366 | B2* | 6/2009 | Sugimoto | G06F 3/0418 345/173 |
| 8,618,910 | B2* | 12/2013 | Setlak | G06K 9/0002 310/316.01 |
| 8,730,186 | B2 | 5/2014 | Tamura et al. | |
| 8,730,199 | B2 | 5/2014 | Sleeman et al. | |
| 8,743,082 | B2* | 6/2014 | Ganapathi | G02B 26/0833 178/18.01 |
| 9,024,910 | B2* | 5/2015 | Stephanou | G06F 3/0414 345/173 |
| 9,030,440 | B2* | 5/2015 | Pope | G06F 3/044 345/174 |
| 9,251,329 | B2* | 2/2016 | Lien | G06F 21/32 |
| 9,354,752 | B2* | 5/2016 | Kanehira | G06F 3/0414 |
| 2011/0007013 | A1* | 1/2011 | Shoji | G06F 3/044 345/173 |
| 2012/0038577 | A1 | 2/2012 | Brown et al. | |

OTHER PUBLICATIONS

Feist, "Samsung snags patent for new pressure sensitive touch-screens," posted on AndroidAuthority.com at URL: http://www.androidauthority.com/samsung-patent-pressure-sensitive-touchscreens-354860, Mar. 7, 2014, 1 page.

* cited by examiner

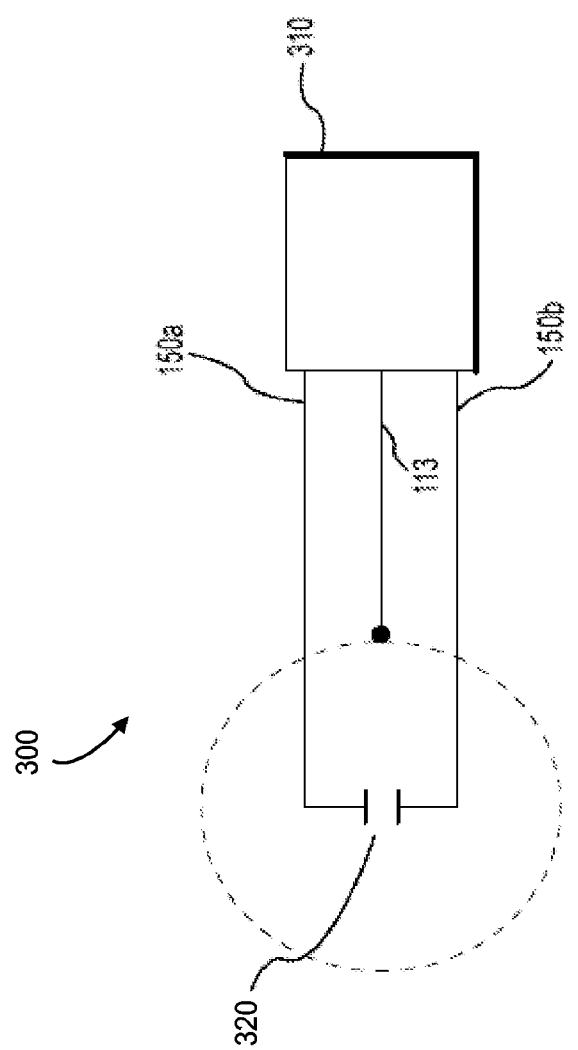

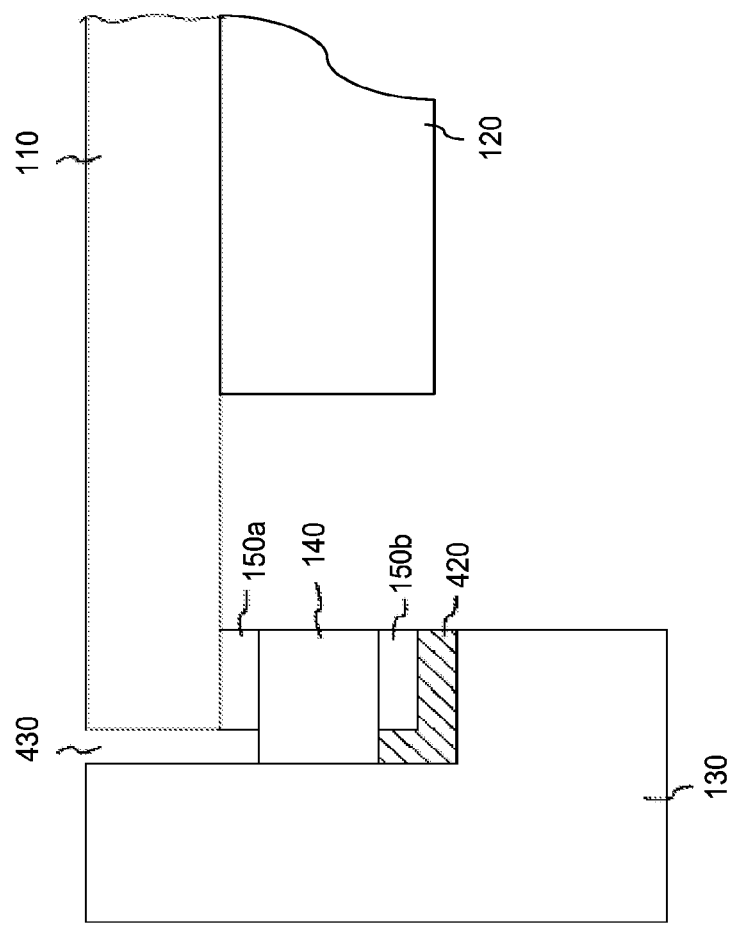

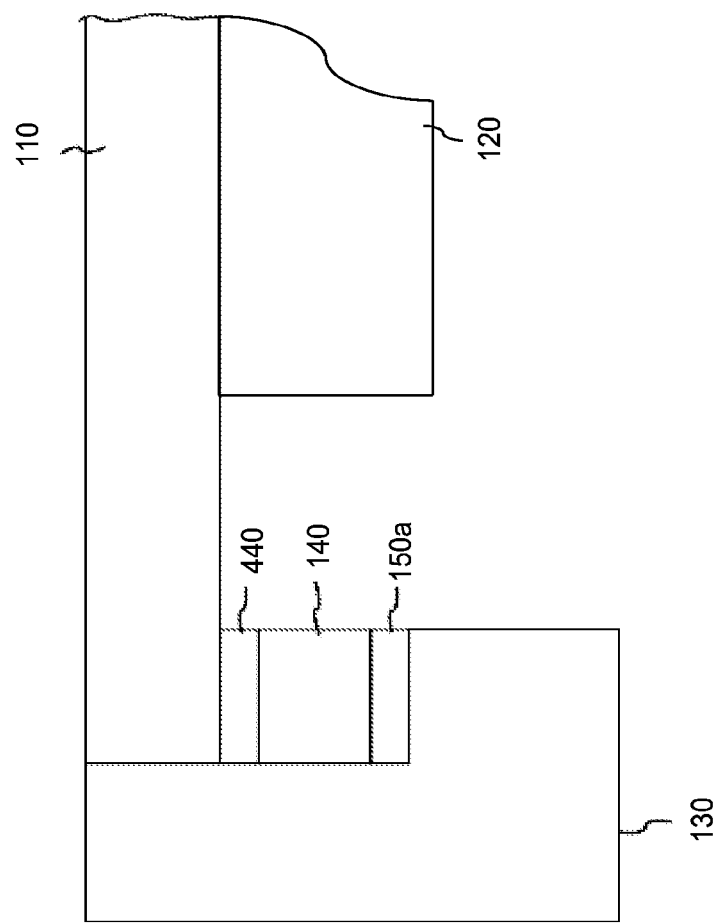

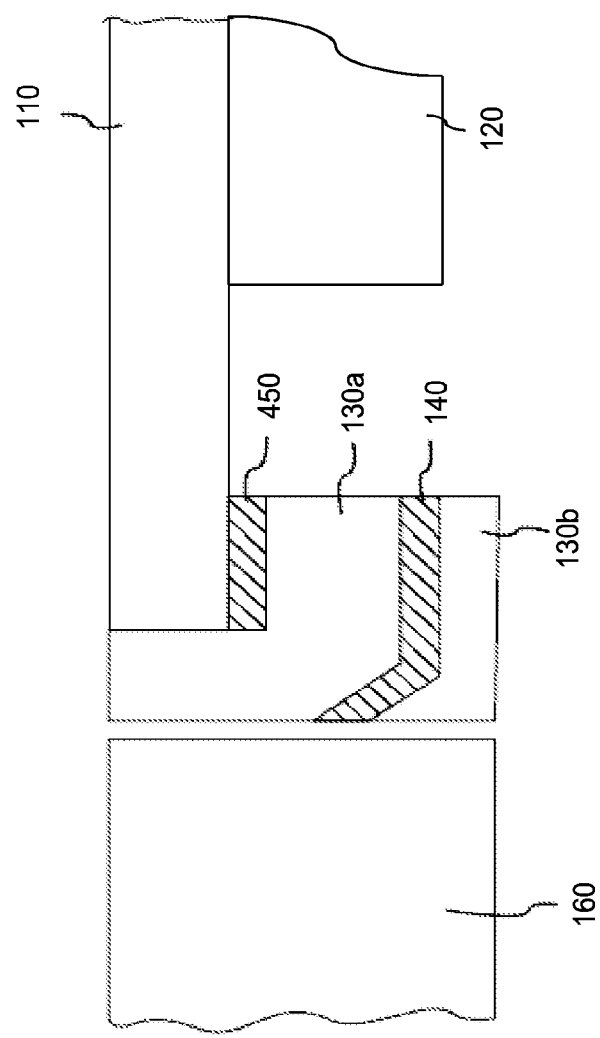

FORCE-SENSITIVE FINGERPRINT SENSING INPUT

CROSS-REFERENCE TO RELATED APPLICATION

This application is a 35 U.S.C. 371 application of PCT/US2013/032683, which was filed on Mar. 15, 2013, and entitled "Force-Sensitive Fingerprint Sensing Input," which is incorporated by reference as if fully disclosed herein.

TECHNICAL FIELD

This application generally relates to an electronic device, and more particularly to an electronic device that includes a function button and the electronic device is adapted to obtain fingerprint information and/or to determine an applied force when the function button is depressed.

BACKGROUND

The security of computing devices has become a greater concern as such devices incorporate or store more and more personal information. Biometrics are often touted as providing high security, since many biometrics are difficult to spoof. However, biometric sensors may be slow and prone to error.

Certain biometrics may likewise have a greater application than just security, presuming biometric input, enrollment and validation may be provided quickly, safely and effectively. For example, a fingerprint may not only provide access to a device for a user, but also serve as a token or indicator for the user.

Additionally, many computing devices rely on binary inputs for user interaction. For example, many computers use keyboards, mice and/or trackpads for user input. Generally, these devices either register an input or they do not. Many keyboards, for example, register an input when sufficient force is applied to a key to collapse a dome switch beneath the key. If insufficient force is applied, no input registered. Likewise, both the force necessary to barely collapse the dome and force far above that necessary to collapse the dome register as the exact same input. This is true of many input devices.

Capacitive sensing devices, such as touch screens, generally are also binary. A touch is sensed and an input generated, or no touch is sensed and there is no input.

Further, given the use of physical contacts, switches and the like in input devices, altering a stack or layout of an input device may prove challenging. Thus, it may be difficult to incorporate new technologies, such as biometric sensing, into certain input devices like buttons, keys, mice and the like.

SUMMARY

In one aspect, an object can apply a force to an input device in an electronic device. One example of an input device is a function button. A resistive element having a mechanically resistive force can be disposed to resist the applied force. By way of example only, the resistive element can include an elastomer or other deformable substance or device that is disposed to resist the applied force. One or more electrodes can be disposed to provide a measure of capacitance based on the applied force. The input device can include a shield that is disposed to reduce parasitic capacitance between the one or more electrodes and the object.

In another aspect, the electronic device can include a fingerprint sensor operably connected to at least one electrode.

In another aspect, the resistive element can be disposed in a ring. For example, the resistive element can be disposed in a ring around a fingerprint sensor. At least one electrode can be implemented as electrode segments that can be disposed in different directions. The electrode segments can partially cover the resistive element. The electrode segments can be used by the electronic device to measure a direction of an applied force.

In another aspect, an electronic device can include an input device, such as a function button, depressible in response to an object applying a force to or on the input device. A resistive element having a mechanically resistive force can be disposed to resist depression of the input device. A first electrode can include a first plurality of tines or plates, and a second electrode can include a second plurality of tines or plates. The first plurality of tines or plates is interlaced with the second plurality of tines or plates to provide a measure of capacitance based on an applied force.

In another aspect, an electronic device can include an input device, such as a function button, depressible in response to a force applied by an object. A resistive element having a mechanically resistive force can be disposed to resist the applied force. A drive electrode can be disposed over a sense electrode, and the drive electrode and the sense electrode provide a measure of capacitance based on depression of the function button.

In another aspect, a method for determining an amount of an applied force can include resisting depression of an input device (e.g., function button) by a resistive element having a mechanically resistive force and measuring a capacitance based on the applied force. By way of example only, the resistive element can include an elastomer or other deformable substance or device that is disposed to resist the force applied to the input device. The measured capacitance can be shielded from parasitic capacitance from an object in proximity or in contact with the input device.

In another aspect, the object can be a user's finger and a fingerprint image of at least a portion of the user's finger can be obtained based on the proximity or contact of the user's finger with the input device.

In another aspect, a direction of the applied force on an input device can be determined.

In another aspect, a method for operating an electronic device can include receiving an applied force measurement based on the depression of an input device (e.g., function button), and receiving a fingerprint image based on the depression of the input device.

BRIEF DESCRIPTION OF THE DRAWINGS

FIG. 3 shows a conceptual drawing of a circuit including electrodes and a shield.

DETAILED DESCRIPTION

Overview

Figure 1:
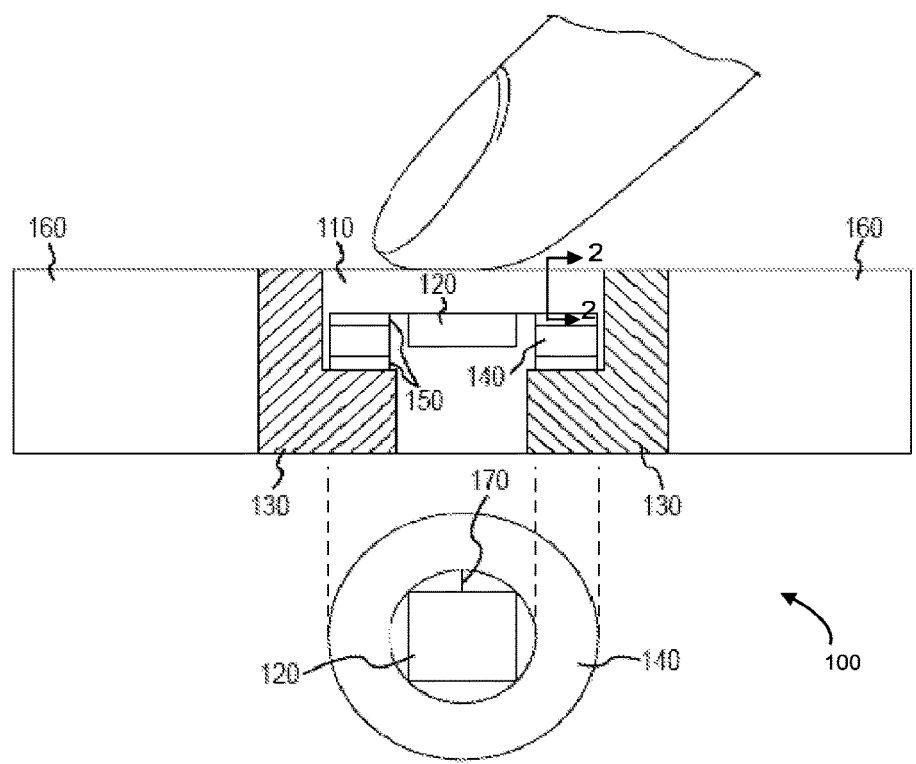
FIG. 1 shows a conceptual drawing of a fingerprint sensor and force sensor system.

This application provides techniques, including devices and structures, and including methods, that can allow a device with a function button to provide both a fingerprint image measurement and an applied force measurement. In one set of embodiments, a set of electrodes for measuring applied force can be disposed in the device for either a mutual capacitance or a self-capacitance measurement of an applied force. A resistance element having a mechanically resistive force can be disposed to resist the applied force. For example, the resistance element can be an elastomer or other deformable substance. For example, a rubber-like substance or other resistive element that resists the applied force can be disposed so that the applied force compresses the resistive element and a capacitance change can be determined based on that applied force. The change in capacitance can be used to determine an amount of applied force.

In one set of embodiments, the set of electrodes for measuring an applied force can be disposed in one or more interlaced layers within a function button, or an element connected thereto. This can have the effect that when the function button is depressed by an object, such as a user's finger, the interlaced layers undergo a change in capacitance that can be measured by an associated circuit or circuits (e.g., a processor). For example, if the interlaced layers are disposed so that depressing the function button causes individual pairs of electrostatic plates to be moved closer together, the capacitance change between those individual pairs of electrostatic plates can be measured and used to determine the applied force.

In one set of embodiments, the set of electrodes for measuring applied force can be disposed in more than one segment, with the effect that an applied force applied in a particular direction can be determined by noting how much of that applied force is applied to each particular segment. For example, the set of electrodes can be disposed in a set of segments arranged around a perimeter of the function button, with the effect that an applied force affects one or more electrodes most when the force is applied in the direction(s) or associated segment(s) of the electrode or electrodes. Moreover, a processor determining the applied force can identify a difference between a force applied in one direction and a force applied in another direction, such as an opposite direction. By way of example only, the processor that determines a difference between the forces applied in the different directions can be a differential sensor, circuit, or processor. The measured difference can provide a measure of whether the applied force is actually being applied at an angle or is being applied strongly on all segments.

Although this application describes exemplary embodiments and variations thereof, still other embodiments of the present disclosure will become apparent to those skilled in the art from the following detailed description, which shows and describes illustrative embodiments of the disclosure. As will be realized, the disclosure is capable of modifications in various obvious aspects, all without departing from the spirit and scope of the present disclosure. The drawings and detailed description are intended to be illustrative in nature and not restrictive.

Terms and Phrases

The text "applied force", and variants thereof, generally refers to force, pressure, torque, or other components that relate to a degree to which one or more physical objects (such as a user's finger) is pressing or pushing, twisting, or otherwise, exerting friction on a face of a device. For a first example, applied force can refer to pressure on a button (or other surface) by a user. For a second example, applied force can refer to an attempt to tilt or twist that button (or other surface) by the user. For a third example, applied force can refer to an attempt to turn a simulated dial or other user presentation on the device by the user.

The text "fingerprint sensor", "fingerprint sensor system", and variants thereof, generally refers to a device that retrieves fingerprint information. For example, a fingerprint sensor can include a device that retrieves fingerprint information, determines if that fingerprint information matches a known fingerprint, and allows access to functions of a device based on whether a match is found.

The text "fingerprint information", and variants thereof, generally refers to one or more images of a user's finger or fingers, one or more images of a portion or portions of a user's finger(s), or data relating to one or more fingerprints or portion(s) of fingerprint(s), such as to compare with information maintained by a device or a remote server.

Fingerprint Sensor and Force Sensor System

FIG. 1 shows a conceptual drawing of a fingerprint sensor and force sensor system.

A system 100 can include a function button 110, a fingerprint sensor 120, and a force sensor system (as described herein). In one embodiment, the system 100 can include the function button 110, a fingerprint sensor system 120, a trim 130, a resistive element 140, a set of electrodes 150, and a frame 160. For example, the trim 130 can be maintained within the frame 160, such as by the frame 160 holding the trim 130 against any applied force exerted by the user's finger.

The resistive element 140 has a mechanically resistive force in one embodiment. By way of example only, the resistive element 140 can be an elastomer or other deformable substance or device, such as a spring. The resistive element 140 is disposed to resist a force applied to the function button 110 to depress the function button.

The resistive element 140 is shown disposed around a perimeter of the function button 110, for example, in a ring. This can have the effect that when an object, such as the user's finger, applies a force to the function button 110 to depress the button 110, the resistive element 140 resists that force such that more force may be required to depress the function button 110.

A second resistive element having a mechanically resistive force (not shown) or a suitable adhesive material can be used to maintain a contact between the trim 130 and the frame 160. This can have the effect of preventing dust from entering the device and possibly causing foreign object damage, and can have the effect of providing the trim 130 and the frame 160 with a relatively optimal degree of friction therebetween.

The fingerprint sensor 120 is shown positioned below the function button 110 and relatively centered with respect to the function button 110. There is no particular requirement that the fingerprint sensor 120 be relatively centered with respect to the function button. However, in one embodiment, it may be easier to obtain fingerprint information when the fingerprint sensor 120 is centered and a user's finger touches the center of the function button 110.

The resistive force provided by the resistive element 140 can serve to hold the electrodes 150 apart until the applied force is sufficient to push them together. This can have the effect that a capacitance measured between the electrodes 150 can indicate how far apart the electrodes 150 are, with the effect that the capacitance measured between the electrodes 150 can indicate how much applied force was presented to overcome the resistive force of the resistive element 140.

A signal path 170 (such as a wire or other conductive node) can operably connect the fingerprint sensor 120 and the electrodes 150 (or directly to the resistive element 140, as described herein). This can have the effect that the fingerprint sensor 120 can assist in determining the measure of capacitance between the electrodes 150, and, in some embodiments, can incorporate that measure of capacitance into its own data. Alternatively, fingerprint sensor 120 can serve as a conduit to traffic data indicative of the capacitance between electrodes 150 to another processing unit. In further alternative embodiments, electrodes 150 can be operably coupled to a processing unit independently of the fingerprint sensor.

In some embodiments, a fingerprint sensor 120 can include a capacitive fingerprint sensor, to which the user can apply their finger, or a portion thereof, to input fingerprint information. Other embodiments, however, are not limited to a capacitive fingerprint sensor. Any suitable fingerprint sensor may be used with embodiments and techniques disclosed herein. Suitable fingerprint sensors include capacitive sensors, ultrasonic sensors, optical sensors, pyro-electric sensors, and so on. In one embodiment, the fingerprint sensor 120 includes a dielectric element, such as the button 110, to which the user applies their finger, or a portion thereof, for capturing fingerprint information.

The fingerprint sensor 120 can be operably connected to a processor, which can maintain a fingerprint information database, and which can attempt to match the fingerprint information against information about known fingerprints from known users. For example, when the processor matches the fingerprint information against a known fingerprint from an authorized user, the processor can take one or more actions in response thereto. In a first such case, the processor can authorize usage of a device for an individual procedure, for a sequence of procedures, for a selected time duration, until a trigger indicating that the user is no longer authorized, or until the user de-authorizes the device. In a second such case, the user can de-authorize the device by turning the device off, or by handing the device to another user.

In one embodiment, the fingerprint sensor 120 can be connected to and be used to authorize a device. For example, the device can include a tablet computer or smart telephone, or similar device, or any other device having touch device capability, the function button 110, or other elements related to the nature of the technology described herein. The device can include a processor (not shown in this figure), program and data memory (not shown in this figure), and instructions (not shown in this figure) directing the processor to perform functions as described herein. The device can also include data memory (not shown in this figure) including fingerprint information, with respect to fingerprints or other biometric information suitable for identifying and authenticating one or more users of the device. For example, the data memory can include one or more images of fingerprints, one or more transformations of fingerprints suitable for matching, or other information with respect to fingerprints.

Details of Button

Figure 2:
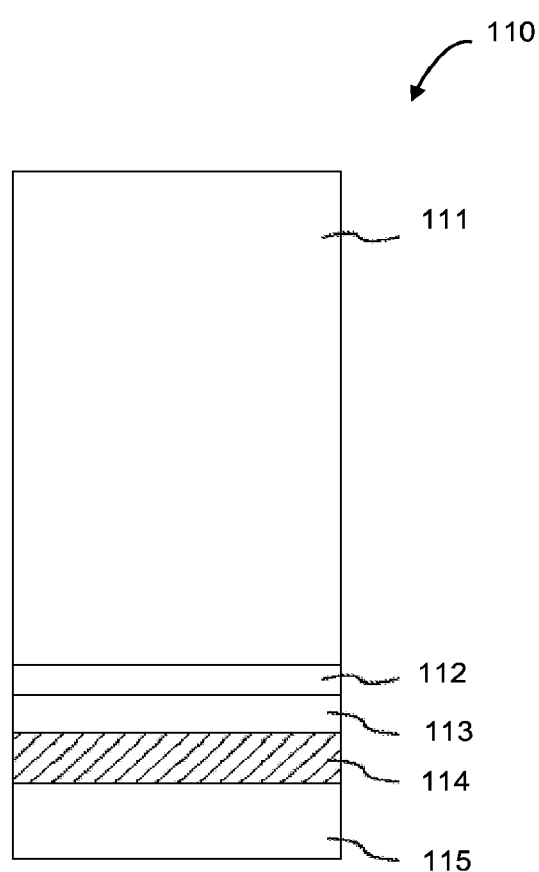
FIG. 2 shows one example of a cross-section view of the function button 110 taken along line 2-2 in FIG. 1.

FIG. 2 shows one example of a cross-section view of the function button 110 along line 2-2 in FIG. 1.

In one embodiment, the function button 110 can include one or more layers of material, including a lens 111, an ink layer 112, a shield layer 113, an insulator 114, and an electrode 115. For example, the lens 111 can include glass, treated glass, chemically treated glass, crystal, ceramics, plastics, or other materials. The ink layer 112 can include a substantially opaque ink, or an ink on which a substantially opaque pattern has been layered, with the effect that the user cannot generally see below the ink layer 112 into the working of the device. The ink layer 112 is optional and can be omitted in other embodiments.

The shield layer 113 can include a conductive material, or other material suitable for protecting the force sensor device from capacitance from an external object, such as the user's finger. The insulator 114 can include a substantially insulative (or otherwise highly resistive) layer, with the effect of preventing electrical current from flowing between the shield layer 113 and the electrode 115. The electrode 115 can include one of the electrodes 150 (as described with respect to FIG. 1, or can include another electrode 115 as otherwise described herein).

Electrodes and Shield

FIG. 3 shows a conceptual drawing of a circuit including electrodes and a shield.

As described herein, in one embodiment, a circuit 300 can include a first electrode 150a, such as one of the electrodes 150 described with respect to FIG. 1, or such as the electrode 115 described with respect to FIG. 2, or such as a first electrode as described with respect to another figure. The circuit 300 can also include a second electrode 150b, such as one of the electrodes 150 described with respect to FIG. 1, or such as the electrode 115 described with respect to FIG. 2, or such as a second electrode as described with respect to another figure. As described herein, the first electrode 150a and the second electrode 150b can be used as drive and sense electrodes in a mutual capacitance sensor.

In one embodiment, the circuit 300 can include a shield 113, such as the shield 113 described with respect to FIG. 2, or such as a shield as described with respect to another figure. As described herein, the shield 113 can protect the measurement of mutual capacitance between the first electrode 150a and the second electrode 150b from a capacitance introduced by an object, such as the user's finger. The shield 113 can be used to reduce parasitic capacitance between the first and second electrodes 150a, 150b and the object.

In alternative embodiments, the circuit 300 can include a first electrode 150a, such as one of the electrodes 150 described with respect to FIG. 1, or such as the electrode 115 described with respect to FIG. 2. As described herein, the first electrode 150a and a separate conductor (such as a shield or a grounding element) can be used in a self-capacitance sensor.

A capacitance 320 can be measured between the electrodes 150a, 150b to determine how far apart the electrodes 150a, 150b are, with the effect that the capacitance 320 measured between the electrodes 150a, 150b can indicate how much force was applied to overcome the resistive force of an resistive element. For example, as force is applied to the function button, the distance between electrodes 150a and 150b can decrease. This can cause the capacitance between electrodes 150a, 150b to increase. The amount the capacitance increases is indicative of the applied force.

In one embodiment, the electrical signals from the first electrode 150a, second electrode 150b, and shield 113, or from just one electrode 150 and a separate conductor, can be operably connected to a processor 310. The processor 310 can be implemented with any suitable processing device, including, but not limited to, a microprocessor or an application specific integrated circuit (ASIC). The processor 310 can measure the electrical signals and determine a measure of applied force in response thereto.

Electrode and Shield Arrangements.

Some possible arrangements of electrodes and a shield in self-capacitive and mutual capacitive modes are shown:

In an embodiment using mutual capacitance, the first electrode 150a can be used as a sense electrode, the second electrode 150b can be used as a drive electrode, and the shield 113 can be used as a grounding element. The first electrode 150a and the second electrode 150b could also be reversed in this arrangement.

In an embodiment using self-capacitance, the first electrode 150a can be used as a sense electrode, the second electrode 150b can be used as a grounding element, and the shield 113 can be used as a shield against the capacitance of the user's finger. The first electrode 150a and the second electrode 150b could also be reversed in this arrangement Fingerprint Sensor and Force Sensor System FIG. 4 (collectively including FIG. 4A, FIG. 4B, FIG. 4C, and FIG. 4D) shows a set of conceptual drawings of a fingerprint sensor and force sensor system.

Mutual Capacitance with Elastomer Below.

Figure 4A:
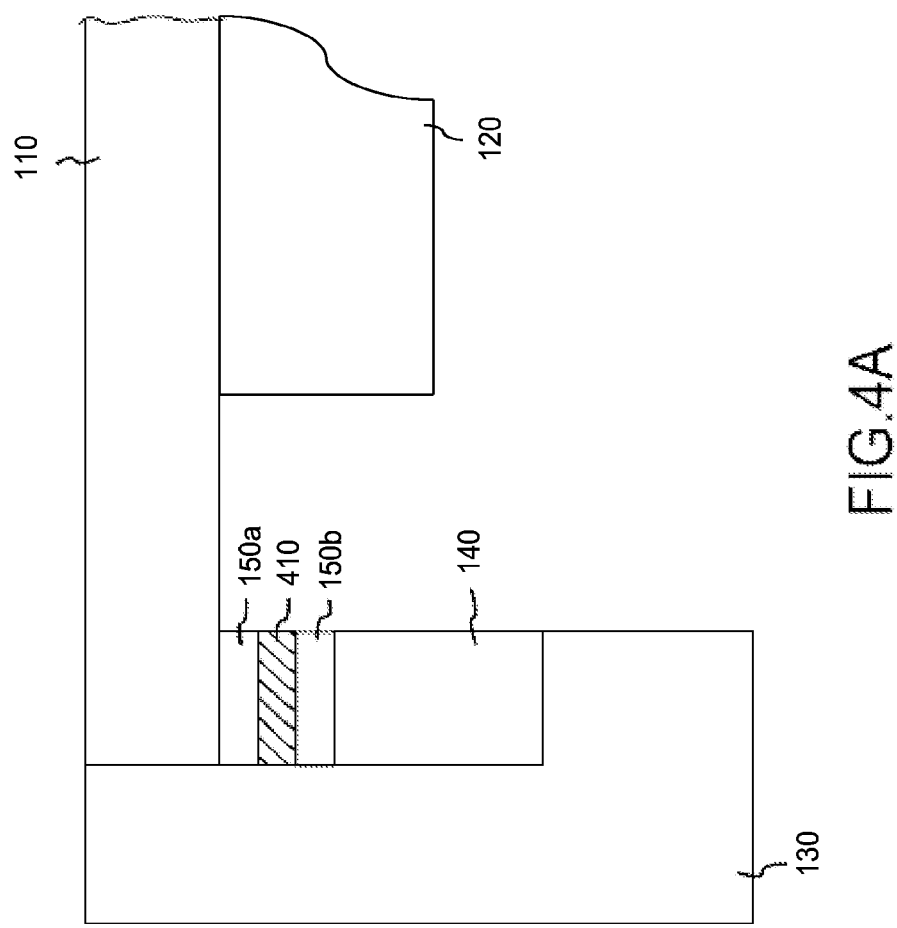
FIG. 4 (collectively including FIG. 4A, FIG. 4B, FIG. 4C, and FIG. 4D) shows a set of conceptual drawings of a fingerprint sensor and force sensor system.

FIG. 4A shows a first conceptual drawing of a fingerprint sensor and force sensor system.

In one embodiment, the function button 110, the trim 130, and the fingerprint sensor 120 can be disposed as described with respect to FIG. 1. The trim 130 can be connected to ground. When a force is applied to the function button 110, the function button 110 presses down on the first electrode 150a (such as described with respect to FIG. 4), an insulator 410, the second electrode 150b (such as described with respect to FIG. 4), and the resistive element 140. The resistive element 140 can be connected to ground.

In such embodiments, when force is applied to the function button 110, a measure of capacitance between the first electrode 150a and the second electrode 150b and ground is affected by the compression of the resistive element 140. The change in capacitance can be measured by the device. For example, the processor 310 (FIG. 3) can be used to determine the capacitance between the first electrode 150a and the second electrode 150b. For example, as force is applied to the function button, the distance between electrodes 150a and 150b can decrease. This can cause the capacitance between electrodes 150a, 150b to increase. The amount the capacitance increases is indicative of the applied force.

A signal path (not shown), such as a wire or other conductive node (see e.g., 170 in FIG. 1) can operably connect the fingerprint sensor 120 to the electrodes 150 (or directly to the resistive element 140). This can have the effect that the fingerprint sensor 120 can determine the measure of capacitance between the electrodes 150, and can incorporate that measure of capacitance into its own data. For example, the fingerprint sensor 120 can incorporate that measure of capacitance into its own measure of capacitance when computing a capacitance between the fingerprint sensor 120 and the user's finger. Alternatively, fingerprint sensor 120 can serve as a conduit to traffic data indicative of the capacitance between electrodes 150 to another processing unit. In further alternative embodiments, electrodes 150 can be operably coupled to a processing unit independently of the fingerprint sensor.

Mutual Capacitance with Elastomer Between.

FIG. 4B shows a second conceptual drawing of a fingerprint sensor and force sensor system.

In one embodiment, the function button 110, the trim 130, and the fingerprint sensor 120 can be disposed as described with respect to FIG. 1. The trim 130 can be connected to ground. When force is applied to the function button 110, the function button 110 presses down on the first electrode 150a (such as described with respect to FIG. 4), the resistive element 140, the second electrode 150b (such as described with respect to FIG. 4), and an insulator 420 between the second electrode 150b and the trim 130. A spacing 430 (or another insulator) can be disposed so that the first electrode 150a does not contact the grounded trim 130.

In such embodiments, when force is applied to the function button 110, a measure of capacitance between the first electrode 150a and the second electrode 150b is affected by the compression of the resistive element 140. The change in capacitance can be measured by the device. For example, the processor 310 (FIG. 3) can be used to determine the capacitance between the first electrode 150a and the second electrode 150b. For example, as force is applied to the function button, the distance between electrodes 150a and 150b can decrease. This can cause the capacitance between electrodes 150a, 150b to increase. The amount the capacitance increases is indicative of the applied force.

A signal path (not shown), such as a wire or other conductive node (see e.g., 170 in FIG. 1) can operably connect the fingerprint sensor 120 to the electrodes 150 (or directly to the resistive element 140). This can have the effect that the fingerprint sensor 120 can determine the measure of capacitance between the electrodes 150, and can incorporate that measure of capacitance into its own data. For example, the fingerprint sensor 120 can incorporate that measure of capacitance into its own measure of capacitance when computing a capacitance between the fingerprint sensor 120 and the user's finger. Alternatively, fingerprint sensor 120 can serve as a conduit to traffic data indicative of the capacitance between electrodes 150 to another processing unit. In further alternative embodiments, electrodes 150 can be operably coupled to a processing unit independently of the fingerprint sensor.

Self-Capacitance with Elastomer Between.

FIG. 4C shows a third conceptual drawing of a fingerprint sensor and force sensor system.

In one embodiment, the function button 110, the trim 130, and the fingerprint sensor 120 can be arranged as described with respect to FIG. 1. The trim 130 can be an insulator. When force is applied to the function button 110, the function button 110 presses down on a grounding element 440, the resistive element 140, and the first electrode 150a (such as described with respect to FIG. 4).

In such embodiments, when force is applied to the function button 110, a measure of capacitance between the first electrode 150a and the grounding element 440 is affected by the compression of the resistive element 140. The change in capacitance can be measured by the device. For example, the processor 310 (FIG. 3) can be used to determine the capacitance between the grounding element 440 and the first electrode 150a.

A signal path (not shown), such as a wire or other conductive node (see e.g., 170 in FIG. 1) can be operably connected between the fingerprint sensor 120 and the first electrode 150a (or directly to the resistive element 140). This can have the effect that the fingerprint sensor 120 can determine the measure of capacitance between the first electrode 150a and the grounding element 440, and can incorporate that measure of capacitance into its own data. For example, the fingerprint sensor 120 can incorporate that measure of capacitance into its own measure of capacitance when computing a capacitance between the fingerprint sensor 120 and the user's finger. Alternatively, fingerprint sensor 120 can serve as a conduit to traffic data indicative of the capacitance between electrodes 150 to another processing unit. In further alternative embodiments, electrodes 150 can be operably coupled to a processing unit independently of the fingerprint sensor.

Self-Capacitance with Split Trim.

FIG. 4D shows a fourth conceptual drawing of a fingerprint sensor and force sensor system.

In one embodiment, the function button 110 and the fingerprint sensor 120 can be disposed as described with respect to FIG. 1, along with a first trim portion 130a. An insulator 450 can be disposed between the function button 110 and the first trim portion 130a. The first trim portion 130a can be connected to ground. The first trim portion 130a can be disposed above the resistive element 140, which, as shown in the figure, is not necessarily disposed in a flat configuration. The resistive element 140 can be disposed over a second trim portion 130b, which can perform the function of the first electrode 150a (such as described with respect to FIG. 4).

In such embodiments, when force is applied to the function button 110, a measure of capacitance between the first trim portion 130a and the second trim portion 130b is affected by the compression of the resistive element 140. The change in capacitance can be measured by the device. For example, the processor 310 (FIG. 3) can be used to determine the capacitance between the first trim portion 130a and the second trim portion 130b.

A signal path (not shown), such as a wire or other conductive node (see e.g., 170 in FIG. 1) can be operably connected between the fingerprint sensor 120 and the trim portions 130 (or directly to the resistive element 140). This can have the effect that the fingerprint sensor 120 can determine the measure of capacitance between the trim portions 130, and can incorporate that measure of capacitance into its own data. For example, the fingerprint sensor 120 can incorporate that measure of capacitance into its own measure of capacitance when computing a capacitance between the fingerprint sensor 120 and the user's finger. Alternatively, fingerprint sensor 120 can serve as a conduit to traffic data indicative of the capacitance between electrodes 150 to another processing unit. In further alternative embodiments, electrodes 150 can be operably coupled to a processing unit independently of the fingerprint sensor.

After reading this application, those skilled in the art will recognize that the area between the first trim portion 130a and the second trim portion 130b is relatively largest in this configuration, with the effect that the device can more easily measure differences in capacitance when the resistive element 140 is compressed.

Although this application is primarily described with respect to changes in capacitance when the resistive element 140 is compressed, the resistive element 140 could have other electrical properties. For a first example, the resistive element 140 could have a difference in resistance when compressed, which could be measured by the device and used to determine (or help determine) an amount of applied force. For a second example, the resistive element 140 could have a piezoelectric effect, such that it changes in its own capacitance or other electrical properties, which could be measured by the device and used to determine (or help determine) an amount of applied force.

Force Sensor Electrodes

FIG. 5 (collectively including FIG. 5A, FIG. 5B, FIG. 5C, and FIG. 5D) shows a set of conceptual drawings of a set of force sensor electrodes.

Compressed Single Plates

Figure 5A:
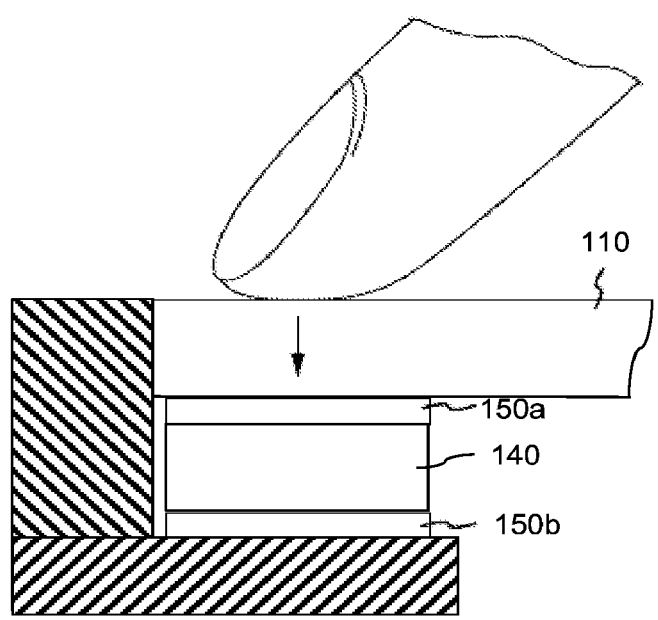
FIG. 5 (collectively including FIG. 5A, FIG. 5B, FIG. 5C, and FIG. 5D) shows a set of conceptual drawings of a set of force sensor electrodes.

FIG. 5A shows a first conceptual drawing of a set of force sensor electrodes. A fingerprint sensor (e.g., 120 in FIG. 1) is not shown in FIG. 5A for simplicity. Alternatively, the fingerprint sensor can be omitted in some embodiments.

In one embodiment, a force applied on the function button 110 causes the first electrode 150a and the second electrode 150b to receive pressure, causing the first electrode 150a and the second electrode 150b to move together when the resistive element 140 is compressed. In another embodiment, the resistive element 140 can be disposed as described with respect to FIG. 4A. The capacitance of the two plates changes based on the change in distance between the two plates. This change in capacitance can be measured by the device. For example, the processor 310 (FIG. 3) can be used to determine the capacitance changes.

Sideways Oriented Electrodes.

Figure 5B:
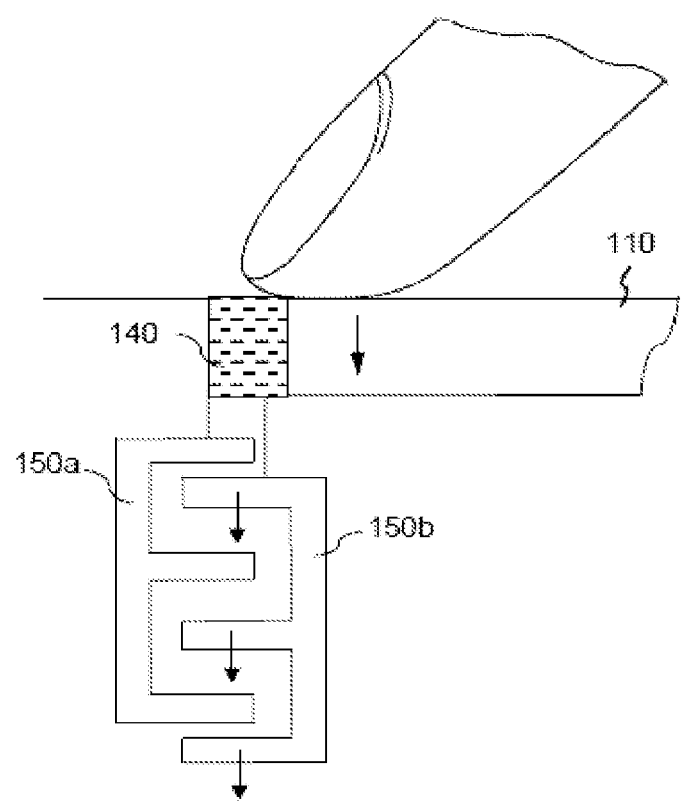

FIG. 5B shows a second conceptual drawing of a set of force sensor electrodes. A fingerprint sensor (e.g., 120 in FIG. 1) is not shown in FIG. 5B for simplicity. Alternatively, the fingerprint sensor can be omitted in some embodiments.

In one embodiment, a force applied on the function button 110 causes the first electrode 150a and the second electrode 150b to receive pressure, causing the second electrode 150b to move relative to the first electrode 150a when the resistive element 140 is compressed. This can cause the tines on the first electrode 150a and the second electrode 150b to move closer together, with the effect that the capacitance of the tines changes based on the change in distance between the two sets of tines. This change in capacitance can be measured by the device. For example, the processor 310 (FIG. 3) can be used to determine the capacitance changes.

The first and second electrodes 150a, 150b can be positioned perpendicular to a surface of the function button 110. The tines of the first and second electrodes can be disposed in parallel to a surface of the function button 110. The tines of the first electrode 150a are interlaced with the tines of the second electrode 150b. The comb-like structure of the first electrode 150a and the second electrode 150b can maximize the sensitivity of the capacitance to force because the comb-like structure maximizes the shared area between the tines. The maximized shared area between the tines can also reduce or minimize the effect of parasitic capacitances between the electrodes and an external object, such as a finger. A shield or shielding can be omitted from the embodiment shown in FIG. 5B due to the reduced sensitivity to parasitic capacitances.

Additionally or alternatively, the resistive element 140 can be disposed as described with respect to FIG. 4A, where the resistive element is disposed below the bottom tine of the second electrode 150b. Alternatively, the first and second electrodes can be embedded in a resistive element.

Multiple Plates Pushed Together.

Figure 5C:
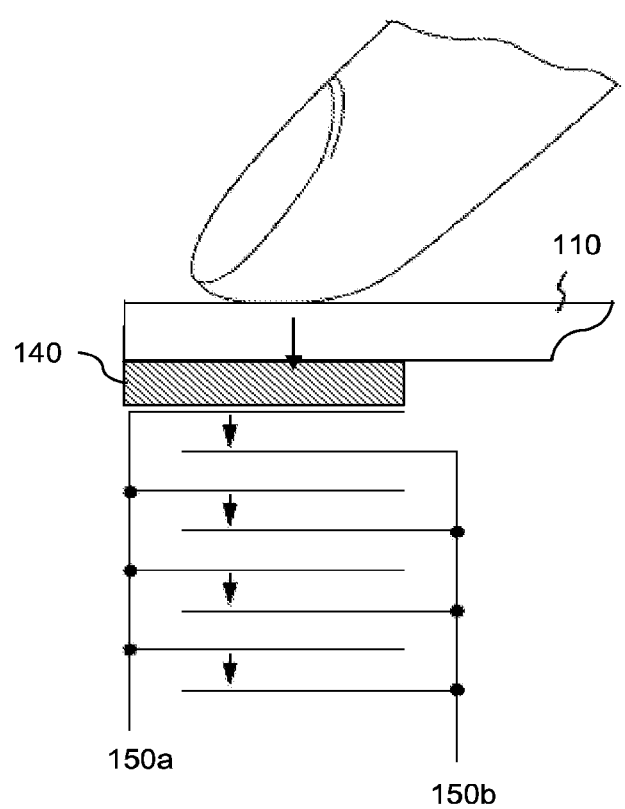

FIG. 5C shows a third conceptual drawing of a set of force sensor electrodes. A fingerprint sensor (e.g., 120 in FIG. 1) is not shown in FIG. 5C for simplicity. Alternatively, the fingerprint sensor can be omitted in some embodiments.

In one embodiment, a force applied on the function button 110 causes the first electrode 150a (a moving electrode) to receive pressure, causing the first electrode 150a to move closer to the second electrode 150b (a stationary electrode), causing the multiple plates of the first electrode 150a to move closer to the multiple plates of the second electrode 150b. The capacitance of the multiple plates changes based on the change in distance between the two sets of plates. This change in capacitance can be measured by the device. For example, the processor 310 (FIG. 3) can be used to determine the capacitance changes.

A resistive element 140 is disposed between the function button 110 and the top plate of the first electrode 150a in the illustrated embodiment. Additionally or alternatively, the resistive element 140 can be disposed as described with respect to FIG. 4A, where the resistive element is disposed below the bottom plate of the first electrode 150a. Alternatively, the first and second electrodes can be embedded in a resistive element.

Like the FIG. 5B embodiment, a shield or shielding can be omitted in the embodiment shown in FIG. 5C.

Multiple Plates Pushed Apart.

Figure 5D:
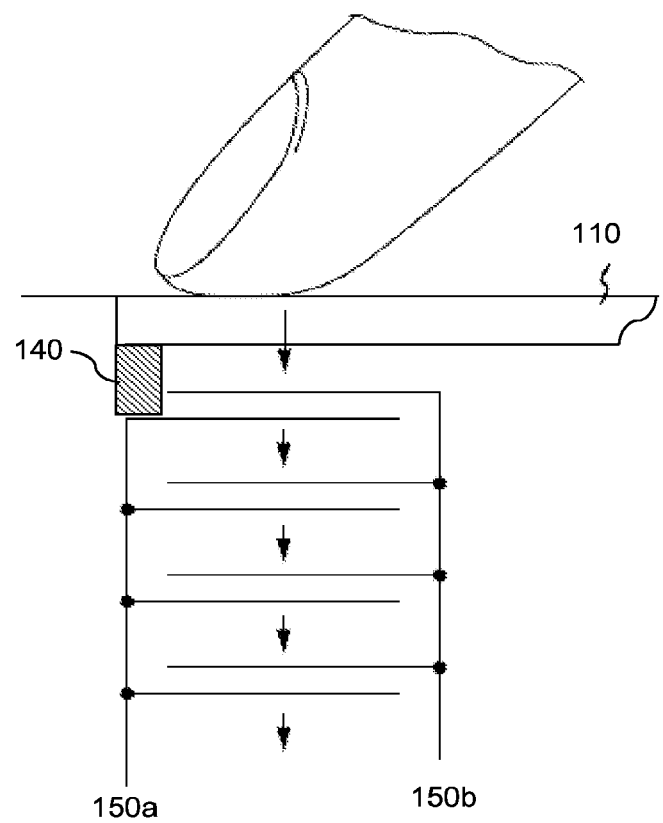

FIG. 5D shows a fourth conceptual drawing of a set of force sensor electrodes. A fingerprint sensor (e.g., 120 in FIG. 1) is not shown in FIG. 5D for simplicity. Alternatively, the fingerprint sensor can be omitted in some embodiments.

In one embodiment, a force applied on the function button 110 causes the first electrode 150a (a moving electrode) to receive pressure, causing the first electrode 150a to move farther away from the second electrode 150b (a stationary electrode), causing the multiple plates of the first electrode 150a to move farther away from the multiple plates of the second electrode 150b. The capacitance of the multiple plates changes based on the change in distance between the two sets of plates. This change in capacitance can be measured by the device. For example, the processor 310 (FIG. 3) can be used to determine the capacitance changes.

A resistive element 140 is disposed between the button 110 and the top plate of the first electrode 150a in the illustrated embodiment. Additionally or alternatively, the resistive element 140 can be disposed as described with respect to FIG. 4A, where the resistive element is disposed below the bottom plate of the first electrode 150a. Alternatively, the first and second electrodes can be embedded in a resistive element.

Like the FIG. 5B embodiment, a shield or shielding can be omitted in the embodiment shown in FIG. 5D.

Directional Force Sensor Electrodes

Figure 6:
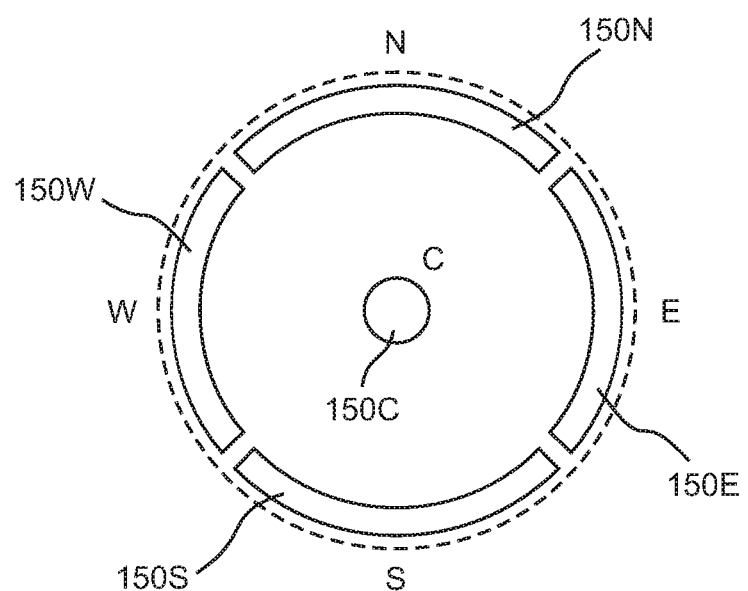
FIG. 6 shows a conceptual drawing of a set of directional force sensor electrodes.

FIG. 6 shows a conceptual drawing of a set of directional force sensor electrodes.

In one embodiment, the electrodes can be disposed so that only a portion of the resistive element (not shown) is covered by those electrodes. The resistive element can be disposed as described with respect to FIG. 1. This can have the effect that applied force can be measured only when a portion of an electrode or resistive element receives pressure from the user's finger.

For a first example, the electrodes can be divided into segments, 150N (north), 150E (east), 150S (south), 150W (west), and 150C disposed at a center (C) location. The set of electrode segments 150N, 150E, 150S, and 150W can be disposed in different directions. In such cases, the device can determine if the force is being applied at an angle, such as (just for example) if the electrode segment 150N receives significant applied force while the other segments do not. In such cases, the device can also apply differential sensing, such as subtracting the applied force on the electrode segment 150S from applied force on the electrode segment 150N, with the effect that even relatively small angles of applied force can be detected. The electrode segment 150C can be used by the device to determine if in fact the applied force is primarily center directed, even if there are small differences in the angle of applied force that are detected. By way of example only, a processor, such as the processor 310 in FIG. 3, can be used to determine the differential sensing.

For a second example, the electrode segments 150N, 150E, 150S, 150W, can be divided into a different number of sections, such as eight, sixteen, and otherwise. It would also be possible to divide the electrode segments into only three segments and still compute an angle of applied force.

Although the electrode segments 150N, 150E, 150S, 150W are shown as divided into sections of a circle, in the context of the invention, there is no particular requirement for any such limitation. For example, the electrode segments can be extended and divided into pie-shaped segments, or otherwise.

Method of Operation

Figure 7:
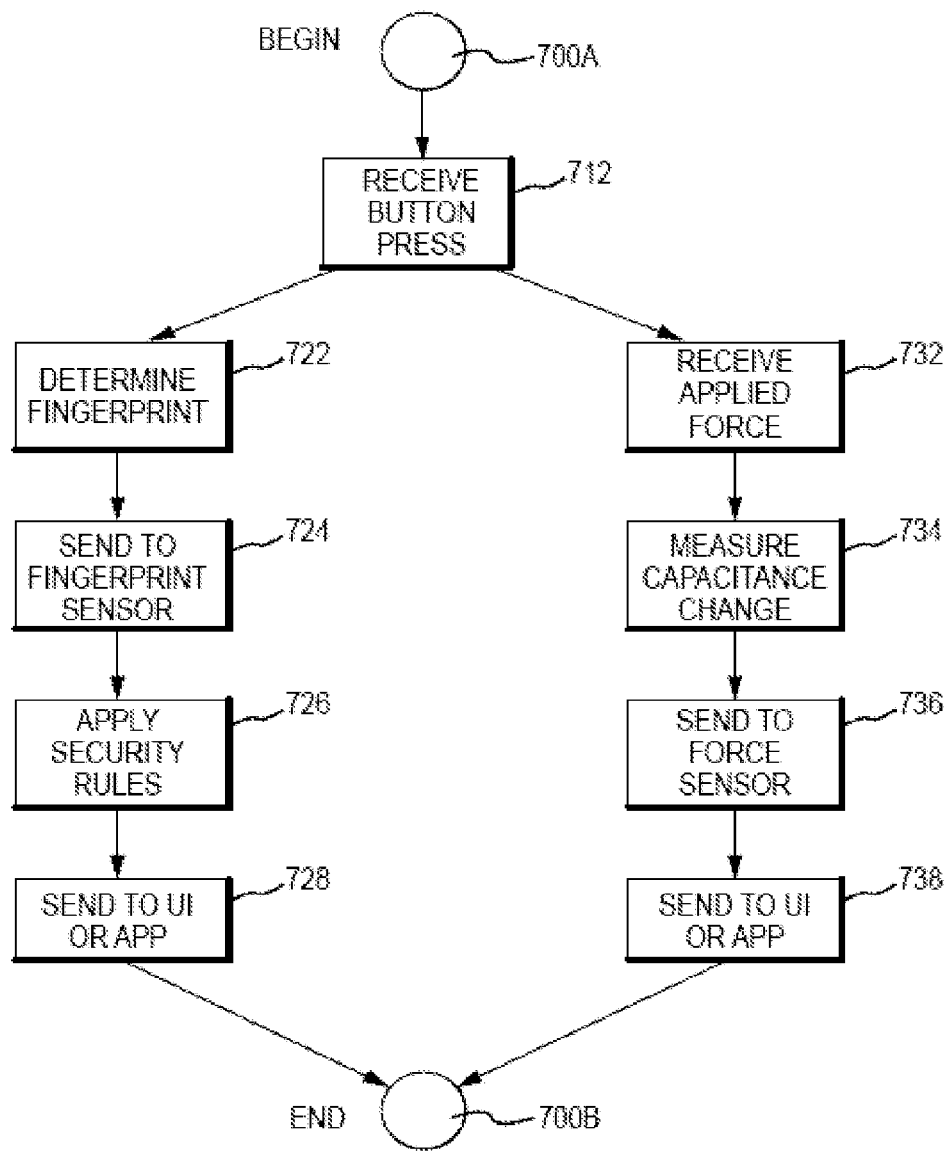
FIG. 7 shows a conceptual drawing of a method of operation.

FIG. 7 shows a conceptual drawing of a method of operation.

Although these flow points and method blocks are shown performed in a particular order, in the context of the invention, there is no particular requirement for any such limitation. For example, the flow points and method blocks could be performed in a different order, concurrently, in parallel, or otherwise.

Although these flow points and method blocks are sometimes described as being performed by the method 700, in one embodiment, they can be performed by a processor in the device, or by hardware provided for the fingerprint sensor system. Although these flow points and method blocks are described as performed by a general-purpose processor, in the context of the invention, there is no particular requirement for any such limitation. For example, one or more such method blocks could be performed by special purpose processor, by another circuit, or be offloaded to other processors or other circuits in other devices, such as by offloading those functions to nearby devices using wireless technology or by offloading those functions to cloud computing functions.

At a flow point 700A, the method 700 is ready to begin.

At a block 712, the method 700 (that is, the device) receives a button press from an object, such as the user's finger. The button press can have at least some applied force associated therewith.

The method 700 conducts a set of blocks 722, 724, 726, and 728 with respect to detecting the user's fingerprint, possibly concurrently with a set of blocks 732, 734, 736, and 738 with respect to measuring the applied force.

At block 722, the method 700 attempts to determine the user's fingerprint. In one embodiment, the method 700 receives a capacitive measure of fingerprint ridges and valleys from which the user's fingerprint can be determined.

At block 724, the method 700 sends the fingerprint information to a processor (such as the fingerprint sensor 120 and possibly any other processors connected thereto) to determine the fingerprint and any users associated with that fingerprint.

At block 726, the method 700 (that is, the device and any processors associated with this step) applies security rules with respect to the fingerprint. For a first example, if the fingerprint is associated with a user who is authorized to use the device, or a particular application or a particular user interface function, the device can allow this based on the fingerprint. For a second example, if the fingerprint is not associated with a user who is authorized to use the device, or is associated with a user known to be unauthorized to use the device, or a particular application or a particular user interface function, the device can disallow this based on the fingerprint.

At block 728, the method 700 (that is, the device and any processors associated with this step) sends the security results to the application or user interface function, based on which the application or user interface function can allow or deny the user's attempt to use it.

After this block, the method 700 proceeds with the flow point 700B.

At block 732, the method 700 receives the applied force. As described herein, in one embodiment, the applied force can be received by pressure on the resistive element 140. In alternative embodiments, the measure of applied force, and an angular direction thereof, can be received by pressure on one or more of the electrode segments described with respect to FIG. 6.

At block 734, the method 700 attempts to determine a measure of applied force. As described herein, in one embodiment, the measure of applied force can be determined based on a capacitive measure in response to pressure on the resistive element 140. In alternative embodiments, the measure of applied force, and an angular direction thereof, can be determined based on a capacitive measure in response to pressure on one or more of the electrode segments described with respect to FIG. 6.

At block 736, the method 700 sends the measure of applied force to the force sensor (as described herein), or to a processor or other computing device.

At block 738, the method 700 sends the measure of applied force to the application or the user interface element, which can determine what effect should be presented to the user in response thereto. For a first example, the user can have a different effect presented in response to a relatively soft touch, in contrast with a relatively hard touch. For a second example, the user can have a different effect presented based on an analog measure of applied force, such as an attempt to turn a dial or wheel, or push or turn a joystick, in a gaming application.

After this block, the method 700 proceeds with the flow point 700B. At a flow point 700B, the method 700 is over. In one embodiment, the method 700 repeats as long as the device is powered on.

Touch I/O Device including Fingerprint Recognition System

Figure 8A:
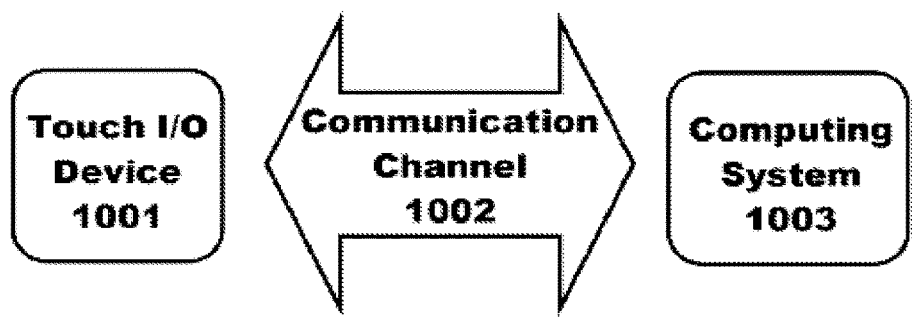
FIG. 8 (collectively including FIG. 8A and FIG. 8B) shows a conceptual drawing of a touch I/O device including a fingerprint recognition system.
Figure 8B:
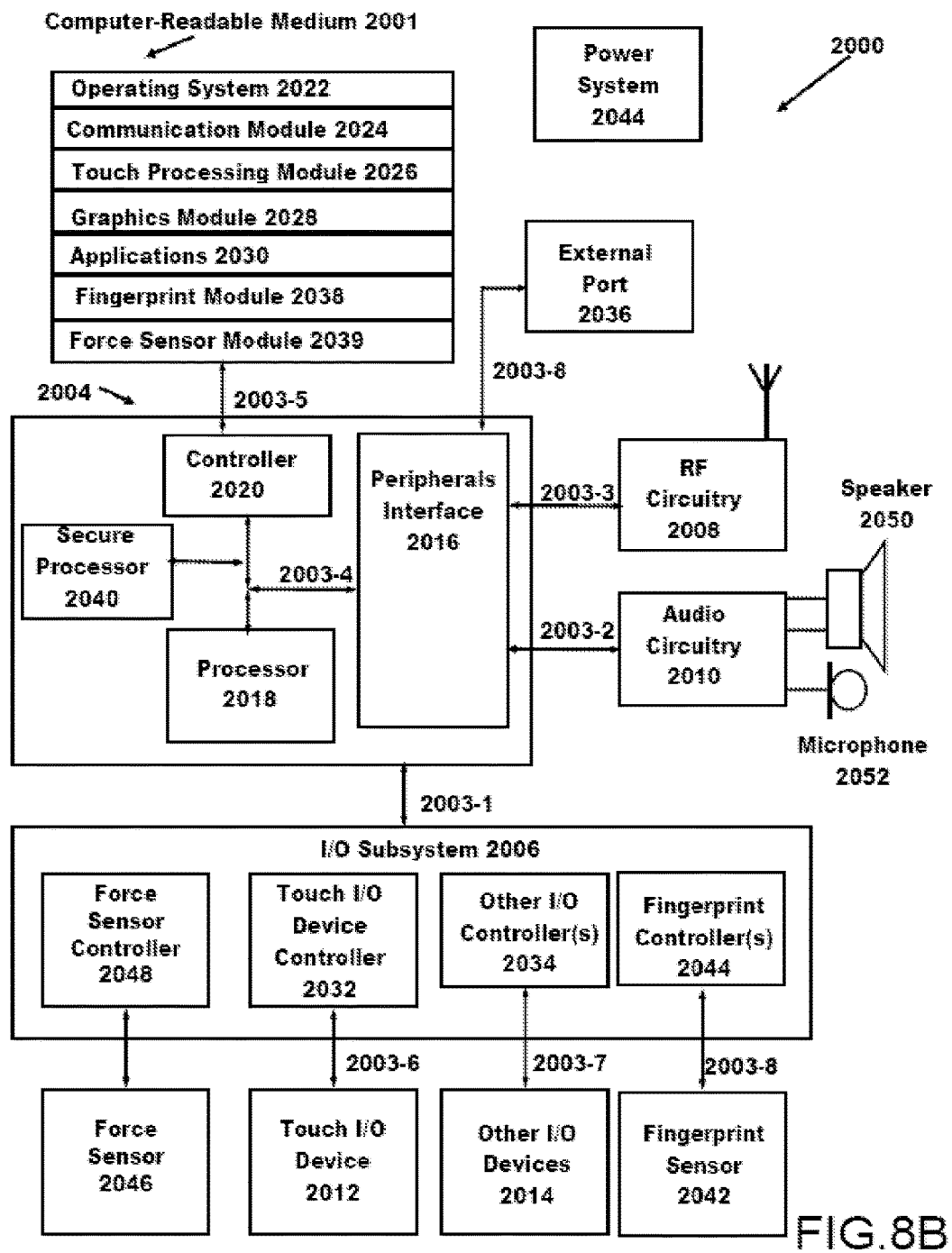

FIG. 8 (collectively including FIG. 8A and FIG. 8B) shows a conceptual drawing of a touch I/O device including a fingerprint recognition system and a force recognition system.

A touch I/O electronic device or system 1000 can include a touch-sensitive input/output (touch I/O) device 1006 in communication with computing system 1008 via communications channel 1010.

Described embodiments may include touch I/O device 1006 that can receive touch input for interacting with computing system 1008 via wired or wireless communication channel 1002. Touch I/O device 1006 may be used to provide user input to computing system 1008 in lieu of or in combination with other input devices such as a keyboard, a mouse, or otherwise. One or more touch I/O devices 1006 may be used for providing user input to computing system 1008. Touch I/O device 1006 may be an integral part of computing system 1008 (e.g., touch screen on a laptop) or may be separate from computing system 1008.

For a first example, touch I/O device 1006 can interact with a user with the user touching the touch I/O device 1006 with the user's finger (or otherwise bringing the user's finger near to the touch I/O device 1006), with the effect that the touch I/O device 1006 can receive fingerprint image data, and optionally provide feedback to the user that the fingerprint image data was received.

For a second example, touch I/O device 1006 can interact with a user with the user applying force to the touch I/O device 1006 with the user's finger (or a tool, such as a stylus), with the effect that the touch I/O device 1006 can receive applied force data, and optionally provide feedback to the user that the applied force data was received.

Touch I/O device 1006 may include a touch sensitive panel which is wholly or partially transparent, semitransparent, non-transparent, opaque or any combination thereof. Touch I/O device 1006 may be embodied as a touch screen, touch pad, a touch screen functioning as a touch pad (e.g., a touch screen replacing the touchpad of a laptop), a touch screen or touchpad combined or incorporated with any other input device (e.g., a touch screen or touchpad disposed on a keyboard, disposed on a trackpad, or other pointing device) or any multi-dimensional object having a touch sensitive surface for receiving touch input, or another type of input device or input/output device.

In one example, touch I/O device 1006 embodied as a touch screen may include a transparent and/or semitransparent touch sensitive panel partially or wholly positioned over at least a portion of a display. According to this embodiment, touch I/O device 1006 functions to display graphical data transmitted from computing system 1008 (and/or another source) and also functions to receive user input. In other embodiments, touch I/O device 1006 may be embodied as an integrated touch screen where touch sensitive components/devices are integral with display components/devices. In still other embodiments a touch screen may be used as a supplemental or additional display screen for displaying supplemental or the same graphical data as a primary display and to receive touch input.

Touch I/O device 1006 may be configured to detect the location of one or more touches or near touches on device 1001 based on capacitive, resistive, optical, acoustic, inductive, mechanical, chemical measurements, or any phenomena that can be measured with respect to the occurrences of the one or more touches or near touches in proximity to device 1001. Software, hardware, firmware or any combination thereof may be used to process the measurements of the detected touches to identify and track one or more gestures, fingerprints, or applied forces. A gesture, fingerprint, or applied force may correspond to stationary or non-stationary, single or multiple, touches or near touches on touch I/O device 1006. A gesture, fingerprint, or applied force may be performed by moving one or more fingers or other objects in a particular manner on touch I/O device 1006 such as tapping, pressing, rocking, scrubbing, twisting, changing orientation, pressing with varying pressure and the like at essentially the same time, contiguously, or consecutively. A gesture, fingerprint, or applied force may be characterized by, but is not limited to a pinching, sliding, swiping, rotating, flexing, dragging, or tapping motion between or with any other finger or fingers. A single gesture may be performed with one or more hands, by one or more users, or any combination thereof.

Computing system 1008 may drive a display with graphical data to display a graphical user interface (GUI). The GUI may be configured to receive touch input and applied force input via touch I/O device 1006. Embodied as a touch screen, touch I/O device 1006 may display the GUI. Alternatively, the GUI may be displayed on a display separate from touch I/O device 1006. The GUI may include graphical elements displayed at particular locations within the interface. Graphical elements may include but are not limited to a variety of displayed virtual input devices including virtual scroll wheels, a virtual keyboard, virtual knobs, virtual buttons, any virtual UI, and the like. A user may perform gestures at one or more particular locations on touch I/O device 1006 which may be associated with the graphical elements of the GUI. In other embodiments, the user may perform gestures at one or more locations that are independent of the locations of graphical elements of the GUI. Gestures performed on touch I/O device 1006 may directly or indirectly manipulate, control, modify, move, actuate, initiate or generally affect graphical elements such as cursors, icons, media files, lists, text, all or portions of images, or the like within the GUI. For instance, in the case of a touch screen, a user may directly interact with a graphical element by performing a gesture over the graphical element on the touch screen. Alternatively, a touch pad generally provides indirect interaction. Gestures may also affect non-displayed GUI elements (e.g., causing user interfaces to appear) or may affect other actions within computing system 1008 (e.g., affect a state or mode of a GUI, application, or operating system). Gestures may or may not be performed on touch I/O device 1006 in conjunction with a displayed cursor. For instance, in the case in which gestures are performed on a touchpad, a cursor (or pointer) may be displayed on a display screen or touch screen and the cursor may be controlled via touch input on the touchpad to interact with graphical objects on the display screen. In other embodiments in which gestures are performed directly on a touch screen, a user may interact directly with objects on the touch screen, with or without a cursor or pointer being displayed on the touch screen.

Feedback may be provided to the user via communication channel 1010 based on the touch or near touches on touch I/O device 1006. Feedback may be transmitted optically, mechanically, electrically, olfactory, acoustically, or the like or any combination thereof and in a variable or non-variable manner. For example, feedback can include interaction with a user indicating (A) that one or more sets of fingerprint image information have been received, (B) that one or more sets of fingerprint image information have been enrolled in a database, (C) that one or more sets of fingerprint image information have been confirmed as associated with the user, or otherwise. Similarly, feedback can include interaction with the user indicating (A) that one or more sets of applied force information have been received, (B) that one or more sets of applied force information have been interpreted.

Attention is now directed towards embodiments of a system architecture that may be embodied within any portable or non-portable device including but not limited to a communication device (e.g. mobile phone, smart phone), a multi-media device (e.g., MP3 player, TV, radio), a portable or handheld computer (e.g., tablet, netbook, laptop), a desktop computer, an All-In-One desktop, a peripheral device, or any other system or device adaptable to the inclusion of system architecture 2000, including combinations of two or more of these types of devices. A block diagram of one embodiment of system 2000 generally includes one or more computer-readable mediums 2001, processing system 2004, Input/Output (I/O) subsystem 2006, radio frequency (RF) circuitry 2008 and audio circuitry 2010. These components may be connected by one or more communication buses or signal lines 2003. Each such bus or signal line may be denoted in the form 2003-X, where X is a unique number. The bus or signal line may carry data of the appropriate type between components; each bus or signal line may differ from other buses/lines, but may perform generally similar operations.

It should be apparent that the architecture shown in the figure is only one example architecture of system 2000, and that system 2000 could have more or fewer components than shown, or a different configuration of components. The various components shown in the figure can be implemented in hardware, software, firmware or any combination thereof, including one or more signal processing and/or application specific integrated circuits.

RF circuitry 2008 is used to send and receive information over a wireless link or network to one or more other devices and includes well-known circuitry for performing this function. RF circuitry 2008 and audio circuitry 2010 are connected to processing system 2004 via peripherals interface 2016. Interface 2016 includes various known components for establishing and maintaining communication between peripherals and processing system 2004. Audio circuitry 2010 is connected to audio speaker 2050 and microphone 2052 and includes known circuitry for processing voice signals received from interface 2016 to enable a user to communicate in real-time with other users. In some embodiments, audio circuitry 2010 includes a headphone jack (not shown).

Peripherals interface 2016 connects the input and output peripherals of the system to processor 2018 and computer-readable medium 2001. One or more processors 2018 communicate with one or more computer-readable mediums 2001 via controller 2020. Computer-readable medium 2001 can be any device or medium that can store code and/or data for use by one or more processors 2018. Medium 2001 can include a memory hierarchy, including but not limited to cache, main memory and secondary memory. The memory hierarchy can be implemented using any combination of RAM (e.g., SRAM, DRAM, DDRAM), ROM, FLASH, magnetic and/or optical storage devices, such as disk drives, magnetic tape, CDs (compact disks) and DVDs (digital video discs). Medium 2001 may also include a transmission medium for carrying information-bearing signals indicative of computer instructions or data (with or without a carrier wave upon which the signals are modulated). For example, the transmission medium may include a communications network, including but not limited to the Internet (also referred to as the World Wide Web), intranet(s), Local Area Networks (LANs), Wide Local Area Networks (WLANs), Storage Area Networks (SANs), Metropolitan Area Networks (MAN) and the like.

One or more processors 2018 run various software components stored in medium 2001 to perform various functions for system 2000. In some embodiments, the software components include operating system 2022, communication module (or set of instructions) 2024, touch processing module (or set of instructions) 2026, graphics module (or set of instructions) 2028, one or more applications (or set of instructions) 2030, fingerprint sensing module (or set of instructions) 2038, and force sensing modules (or set of instructions) 2039. Each of these modules and above noted applications correspond to a set of instructions for performing one or more functions described above and the methods described in this application (e.g., the computer-implemented methods and other information processing methods described herein). These modules (i.e., sets of instructions) need not be implemented as separate software programs, procedures or modules, and thus various subsets of these modules may be combined or otherwise rearranged in various embodiments. In some embodiments, medium 2001 may store a subset of the modules and data structures identified above. Furthermore, medium 2001 may store additional modules and data structures not described above.

Operating system 2022 includes various procedures, sets of instructions, software components and/or drivers for controlling and managing general system tasks (e.g., memory management, storage device control, power management, etc.) and facilitates communication between various hardware and software components.

Communication module 2024 facilitates communication with other devices over one or more external ports 2036 or via RF circuitry 2008 and includes various software components for handling data received from RF circuitry 2008 and/or external port 2036.

Graphics module 2028 includes various known software components for rendering, animating and displaying graphical objects on a display surface. In embodiments wherein touch I/O device 2012 is a touch sensitive display (e.g., touch screen), graphics module 2028 includes components for rendering, displaying, and animating objects on the touch sensitive display.

One or more applications 2030 can include any applications installed on system 2000, including without limitation, a browser, address book, contact list, email, instant messaging, word processing, keyboard emulation, widgets, JAVA-enabled applications, encryption, digital rights management, voice recognition, voice replication, location determination capability (such as that provided by the global positioning system (GPS)), a music player, etc.

Touch processing module 2026 includes various software components for performing various tasks associated with touch I/O device 2012 including but not limited to receiving and processing touch input received from I/O device 2012 via touch I/O device controller 2032.

System 2000 may further include fingerprint sensing module 2038 for performing the method/functions as described herein in connection with figures as shown herein. Fingerprint sensing module 2038 may at least function to perform various tasks associated with the fingerprint sensor, such as receiving and processing fingerprint sensor input. The fingerprint sensing module 2038 may also control certain operational aspects of the fingerprint sensor 2042, such as its capture of fingerprint data and/or transmission of the same to the processor 2018 and/or secure processor 2040. Module 2038 may also interact with the touch I/O device 2012, graphics module 2028 or other graphical display. Module 2038 may be embodied as hardware, software, firmware, or any combination thereof. Although module 2038 is shown to reside within medium 2001, all or portions of module 2038 may be embodied within other components within system 2000 or may be wholly embodied as a separate component within system 2000.

System 200 may further include force sensing module 2039 for performing the method/functions as described herein in connection with figures as shown herein. Force sensing module 2039 may at least function to perform various tasks associated with the force sensor, such as receiving and processing applied force sensor input. The force sensing module 2039 may also control certain operational aspects of the force sensor 2046, such as its capture of applied force data and/or transmission of the same to the processor 2018 and/or secure processor 2040. Module 2039 may be embodied as hardware, software, firmware, or any combination thereof. Although module 2039 is shown to reside within medium 2001, all or portions of module 2039 may be embodied within other components within system 2000 or may be wholly embodied as a separate component within system 2000.

I/O subsystem 2006 is connected to touch I/O device 2012 and one or more other I/O devices 2014 for controlling or performing various functions. Touch I/O device 2012 communicates with processing system 2004 via touch I/O device controller 2032, which includes various components for processing user touch input (e.g., scanning hardware). One or more other input controllers 2034 receives/sends electrical signals from/to other I/O devices 2014. Other I/O devices 2014 may include physical buttons, dials, slider switches, sticks, keyboards, touch pads, additional display screens, or any combination thereof.

If embodied as a touch screen, touch I/O device 2012 displays visual output to the user in a GUI. The visual output may include text, graphics, video, and any combination thereof. Some or all of the visual output may correspond to user-interface objects. Touch I/O device 2012 forms a touch-sensitive surface that accepts touch input from the user. Touch I/O device 2012 and touch screen controller 2032 (along with any associated modules and/or sets of instructions in medium 2001) detects and tracks touches or near touches (and any movement or release of the touch) on touch I/O device 2012 and converts the detected touch input into interaction with graphical objects, such as one or more user-interface objects. In the case in which device 2012 is embodied as a touch screen, the user can directly interact with graphical objects that are displayed on the touch screen. Alternatively, in the case in which device 2012 is embodied as a touch device other than a touch screen (e.g., a touch pad), the user may indirectly interact with graphical objects that are displayed on a separate display screen embodied as I/O device 2014.

Touch I/O device 2012 may be analogous to the multi-touch sensitive surface described in the following U.S. Pat. No. 6,323,846 (Westerman et al.), U.S. Pat. No. 6,570,557 (Westerman et al.), and/or U.S. Pat. No. 6,677,932 (Westerman), and/or U.S. Patent Publication 2002/0015024A1, each of which is hereby incorporated by reference.

Embodiments in which touch I/O device 2012 is a touch screen, the touch screen may use LCD (liquid crystal display) technology, LPD (light emitting polymer display) technology, OLED (organic LED), or OEL (organic electro luminescence), although other display technologies may be used in other embodiments.

Feedback may be provided by touch I/O device 2012 based on the user's touch input as well as a state or states of what is being displayed and/or of the computing system.

Feedback may be transmitted optically (e.g., light signal or displayed image), mechanically (e.g., haptic feedback, touch feedback, force feedback, or the like), electrically (e.g., electrical stimulation), olfactory, acoustically (e.g., beep or the like), or the like or any combination thereof and in a variable or non-variable manner.

System 2000 also includes a power system for powering the various hardware components and may include a power management system, one or more power sources, a recharging system, a power failure detection circuit, a power converter or inverter, a power status indicator and any other components typically associated with the generation, management and distribution of power in portable devices.

In some embodiments, peripherals interface 2016, one or more processors 2018, and memory controller 2020 may be implemented on a single chip, such as processing system 2004. In some other embodiments, they may be implemented on separate chips.

In addition to the foregoing, the system 2000 may include a secure processor 2040 in communication with a fingerprint sensor 2042, via a fingerprint I/O controller 2044, or in communication with an applied force sensor 2046, via a for sensor controller 2048.

Sensed fingerprint data may be transmitted through the fingerprint I/O controller 2044 to the processor 2018 and/or the secure processor 2040. In some embodiments, the data is relayed from the fingerprint I/O controller 2044 to the secure processor 2040 directly. Generally, the fingerprint data is encrypted by any of the fingerprint sensor 2042, the fingerprint I/O controller 2044 or another element prior to being transmitted to either processor. The secure processor 2040 may decrypt the data to reconstruct the node.

Fingerprint data may be stored in the computer-readable medium 2001 and accessed as necessary. In some embodiments, only the secure processor 2040 may access stored fingerprint data, while in other embodiments either the secure processor or the processor 2018 may access such data.

Sensed applied force data may be transmitted from the force sensor 2046 through the force sensor controller 2048 to the processor 2018 and/or the secure processor 2040. In some embodiments, the data is relayed from the force sensor controller 2048 to the secure processor directly.

Some embodiments have been generally described herein with respect to a button, but it should be appreciated that the concepts and embodiments disclosed may work with, or be incorporated into, any number of input devices and elements. For example, embodiments described herein may be incorporated into the keys of a keyboard or a mouse surface. Likewise, some embodiments may be incorporated into a track pad, joystick, stylus or other input device. Accordingly, it should be understood that references to a "button" are illustrative only and embodiments may be used with any number or variety of input devices.

While this invention has been described with reference to exemplary embodiments, it will be understood by those skilled in the art that various changes can be made and equivalents may be substituted for elements thereof, without departing from the spirit and scope of the invention. In addition, modifications may be made to adapt the teachings of the invention to particular situations and materials, without departing from the essential scope thereof. Thus, the invention is not limited to the particular examples that are disclosed herein, but encompasses all embodiments falling within the scope of the appended claims.

What is claimed is:

1. An electronic device, comprising:
   an input device depressible in response to a finger;
   a resistive element having a mechanically resistive force, the resistive element disposed to resist depression of the input device;
   one or more electrodes disposed to provide a measure of capacitance based on a depression of the input device, the measure of capacitance indicating an amount of force associated with the depression of the input device, and at least one of the one or more electrodes being coupled to the resistive element; and
   a fingerprint sensor coupled to the input device and configured to capture a fingerprint image in response to the depression of the input device, wherein:
   the resistive element is disposed at least partially around the fingerprint sensor.

2. The electronic device as in claim 1, wherein the input device comprises a function button.

3. The electronic device as in claim 2, wherein the function button comprises a stack of layers, the stack of layers including a lens disposed over an insulator.

4. The electronic device as in claim 3, wherein a shield is included in the stack of layers and is disposed between the lens and the insulator.

5. The electronic device as in claim 1, further comprising a shield disposed over at least one of the one or more electrodes and not disposed over the fingerprint sensor, the shield reducing parasitic capacitance between the at least one of the one or more electrodes and the finger.

6. The electronic device as in claim 5, wherein:
   the one or more electrodes include a first electrode disposed on a first side of the resistive element and a second electrode disposed on a second side of the resistive element, wherein a capacitance between the first electrode and the second electrode changes based on the depression of the input device, and
   the shield includes an electrode disposed between the one or more electrodes.

7. The electronic device as in claim 6, wherein:
   a spacer is disposed between the first electrode and a trim; and
   the second electrode is separated from the trim by an insulator.

8. The electronic device as in claim 1, wherein the resistive element comprises an elastomeric substance disposed to resist depression of the input device.

9. The electronic device as in claim 1, wherein the fingerprint sensor is operably connected to at least one electrode.

10. The electronic device as in claim 1, wherein the resistive element has a resistance that changes under pressure.

11. The electronic device as in claim 1, wherein the resistive element includes a piezoelectric material.

12. The electronic device as in claim 1, wherein the resistive element is disposed in a ring about the fingerprint sensor.

13. The electronic device as in claim 12, wherein at least one electrode comprises electrode segments that are disposed in different directions, and wherein the electronic device can measure a direction and the amount of the force.

14. The electronic device as in claim 1, wherein the one or more electrodes include a first electrode disposed on a first side of an insulator and a second electrode disposed on a second side of the insulator, the first electrode connected to a trim and the second electrode connected to ground.

15. The electronic device as in claim 1, wherein:
   the one or more electrodes includes a first electrode and a second electrode, the first electrode and the second electrode being disposed substantially perpendicular to a surface of the input device, and
   wherein the first electrode and the second electrode include tines disposed substantially parallel to the surface of the input device, the tines of the first electrode interlaced with the tines of the second electrode.

16. The electronic device as in claim 1, wherein:
   the one or more electrodes includes a first electrode that includes a first plurality of plates disposed substantially parallel to a surface of the input device and a second electrode that includes a second plurality of plates disposed substantially parallel to the surface of the input device, the first plurality of plates being interlaced with the second plurality of plates, and wherein depression of the input device adjusts a distance between the first plurality of plates and the second plurality of plates.

17. The electronic device as in claim 1, wherein the one or more electrodes includes a first trim portion disposed below the input device and on a first side of an insulator, and a second trim portion disposed on a second side of the resistive element.

18. The electronic device as in claim 17, wherein the first trim portion is separated from the input device by the insulator.

19. The electronic device as in claim 17, wherein the first trim portion is connected to ground.

20. The electronic device as in claim 17, wherein the second trim portion is connected to the one or more electrodes.

21. The electronic device as in claim 1, wherein the fingerprint sensor is configured to capture the fingerprint image in response to the measure of capacitance exceeding a threshold.

22. The electronic device as in claim 1, wherein the fingerprint sensor is configured to capture the fingerprint image in response to the one or more electrodes providing the measure of capacitance.

23. An electronic device, comprising:
an input device depressible in response to an applied force by a finger;
a fingerprint sensor coupled to the input device and configured to capture a fingerprint image of the finger;
a resistive element having a mechanically resistive force, the resistive element disposed at least partially around the fingerprint sensor and disposed to resist depression of the input device;
a drive electrode;
a sense electrode disposed below the drive electrode, wherein the drive electrode and the sense electrode provide a measure of capacitance based on a depression of the input device; and
a processor configured to determine an amount of the applied force based on the measure of capacitance;
wherein:
at least one of the drive electrode or the sense electrode is coupled to the resistive element.

24. The electronic device as in claim 23, wherein the fingerprint sensor is configured to capture the fingerprint image in response to the measure of capacitance exceeding a threshold.

25. The electronic device as in claim 23, further comprising a shield disposed over at least one of the drive electrode or the sense electrode and not disposed over the fingerprint sensor, the shield reducing parasitic capacitance between the at least one of the drive electrode or the sense electrode and the finger.

26. The electronic device as in claim 23, wherein the resistive element comprises an elastomeric substance disposed to resist depression of the input device.

27. The electronic device as in claim 23, wherein the input device comprises a function button, the function button comprising a stack of layers, the stack of layers including a lens disposed over an insulator.

28. The electronic device as in claim 27, wherein a shield is included in the stack of layers and is disposed between the lens and the insulator.

29. The electronic device as in claim 23, wherein the resistive element has a resistance that changes under pressure.

30. The electronic device as in claim 23, wherein the resistive element includes a piezoelectric material.

31. An electronic device, comprising:
an input device depressible in response to an applied force by a finger;
a fingerprint sensor coupled to the input device and configured to capture a fingerprint image of the finger;
a resistive element disposed at least partially around the fingerprint sensor and configured to resist depression of the input device;
an electrode configured to provide a measure of capacitance based on a depression of the input device; and
a processor configured to determine an amount of the applied force based on the measure of capacitance.

32. The electronic device of claim 31, wherein the electrode is coupled to the resistive element.

* * * * *